United States Patent
Shimizu

(10) Patent No.: US 10,164,400 B2
(45) Date of Patent: Dec. 25, 2018

(54) WAVELENGTH CONVERSION ELEMENT, LIGHT SOURCE DEVICE, AND PROJECTOR

(71) Applicant: SEIKO EPSON CORPORATION, Tokyo (JP)

(72) Inventor: Tetsuo Shimizu, Matsumoto-shi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/710,217

(22) Filed: Sep. 20, 2017

(65) Prior Publication Data

US 2018/0090905 A1 Mar. 29, 2018

(30) Foreign Application Priority Data

Sep. 28, 2016 (JP) ................ 2016-189377

(51) Int. Cl.
| | |
|---|---|
| G03B 21/14 | (2006.01) |
| H04N 9/31 | (2006.01) |
| H01S 3/08 | (2006.01) |
| G03B 21/20 | (2006.01) |
| F21V 9/30 | (2018.01) |
| H01S 5/00 | (2006.01) |
| H01S 5/323 | (2006.01) |
| H01S 5/40 | (2006.01) |

(52) U.S. Cl.
CPC ............ *H01S 3/08004* (2013.01); *F21V 9/30* (2018.02); *G03B 21/204* (2013.01); *H01S 5/005* (2013.01); *H04N 9/3102* (2013.01); *H04N 9/3161* (2013.01); *H01S 5/0071* (2013.01); *H01S 5/32341* (2013.01); *H01S 5/4025* (2013.01)

(58) Field of Classification Search
CPC .... G03B 21/204; G02B 27/141; G02B 26/00; G02B 26/008; G02B 26/007; B32B 17/061; B32B 37/06; B32B 37/12; H01S 3/09004; H04N 9/3161; H04N 9/3102; F21V 9/30
See application file for complete search history.

(56) References Cited

U.S. PATENT DOCUMENTS

| | | | |
|---|---|---|---|
| 8,827,458 B2 * | 9/2014 | Kimura | G03B 21/14 353/31 |
| 2014/0233210 A1 | 8/2014 | Owada | |
| 2018/0119923 A1 * | 5/2018 | Takada | F21V 9/40 |
| 2018/0180975 A1 * | 6/2018 | Furuyama | G03B 21/204 |
| 2018/0194996 A1 * | 7/2018 | Frischeisen | C09K 11/02 |

FOREIGN PATENT DOCUMENTS

JP 2014-137973 A 7/2014

\* cited by examiner

*Primary Examiner* — William C Dowling
(74) *Attorney, Agent, or Firm* — Oliff PLC

(57) ABSTRACT

A wavelength conversion element includes a substrate; a wavelength conversion portion that converts incident light of a first wavelength into light of a second wavelength different from the light of the first wavelength; and a bonding material that bonds the substrate and the wavelength conversion portion. The wavelength conversion portion includes a first surface on which the light of the first wavelength is incident, and a second surface that is positioned on a side opposite to the first surface. The bonding material bonds the substrate and the second surface of the wavelength conversion portion, and forms a bonding region inside the second surface. The wavelength conversion portion is configured such that an irradiation region irradiated with the light of the first wavelength is set on the first surface inside the bonding region.

18 Claims, 5 Drawing Sheets

WAVELENGTH CONVERSION ELEMENT, LIGHT SOURCE DEVICE, AND PROJECTOR

BACKGROUND

1. Technical Field

The present invention relates to a wavelength conversion element, a light source device, and a projector.

2. Related Art

In the related art, there is a projector including a light source device, a light modulation device that modulates light emitted from the light source device and forms an image according to image information, and a project ion optical device that enlarges and projects the formed image on a projection surface such as a screen. As the light source device used in such a projector, a light source device having a solid-state light source and a fluorescent substance layer is known (for example, see JP-A-2014-137973).

The light source device disclosed in JP-A-2014-137973 has a reflection layer, a metal bump (bonding material), and a substrate in addition to the solid-state light source and the fluorescent substance layer. The reflection layer is provided on a surface opposite to a surface on which excitation light is incident from the solid-state light source of the fluorescent substance layer. The bonding material is disposed between the substrate and the reflection layer, and the bonding material supports the fluorescent substance layer and the reflection layer on the substrate. Therefore, the heat of an irradiation region irradiated with excitation light in the fluorescent substance layer is transmitted to the substrate via the bonding material, and the heat of the fluorescent substance layer is radiated by the substrate.

When excitation light is incident on the fluorescent substance layer (wavelength conversion portion) described in JP-A-2014-137973, in a case where the wavelength conversion portion is viewed along an incident direction of light, excitation light may be incident on a region outside a region (hereinafter, may be referred to as a bonding region) in which the bonding material is disposed at the wavelength conversion portion. As described above, since no bonding material is disposed on a surface opposite to the outer region at the wavelength conversion portion, when excitation light is incident on the outer region, the heat of the wavelength conversion portion in the outer region cannot be transmitted to the substrate via the bonding material. Therefore, there is a problem that a temperature of the wavelength conversion portion increases and wavelength conversion efficiency of incident excitation light deteriorates.

SUMMARY

An advantage of some aspects of the invention is to provide a wavelength conversion element capable of suppressing deterioration of the wavelength conversion efficiency, a light source device, and a projector.

A wavelength conversion element according to a first aspect of the invention includes a substrate; a wavelength conversion portion that converts incident light of a first wavelength into light of a second wavelength different from the light of the first wavelength; and a bonding material that bonds the substrate and the wavelength conversion portion. The wavelength conversion portion includes a first surface on which the light of the first wavelength is incident, and a second surface that is positioned on a side opposite to the first surface. The bonding material bonds the substrate and the second surface of the wavelength conversion portion, and forms a bonding region inside the second surface when viewed along an advancing direction of the light incident on the wavelength conversion portion. The wavelength conversion portion is configured such that an irradiation region irradiated with the light of the first wavelength is set on the first surface inside the bonding region when viewed along the advancing direction of the light incident on the wavelength conversion portion.

As the light of the first wavelength, excitation light can be exemplified and as the light of the second wavelength, fluorescent light can be exemplified.

According to the first aspect, since the irradiation region irradiated with the light of the first wavelength is set on the first surface inside the bonding region on the second surface in which the bonding material is positioned when viewed along the advancing direction of the light incident on the wavelength conversion portion, it is possible to suppress that the light of the first wavelength is incident on the region outside the bonding region. In addition, since the bonding material is reliably positioned at a position on the second surface facing the irradiation region of the first surface of the wavelength conversion portion, in a case where a temperature of the irradiation region increases due to the light of the first wavelength with which the irradiation region is irradiated, heat of the irradiation region (wavelength conversion portion) can be transmitted to the substrate via the bonding material. Therefore, since the wavelength conversion portion can be efficiently cooled, it is possible to suppress deterioration of the wavelength conversion efficiency of the wavelength conversion portion.

In the first aspect, it is preferable that the wavelength conversion portion includes a wavelength conversion layer that converts the light of the first wavelength into the light of the second wavelength, and a reflection layer that reflects light incident via wavelength conversion layer, and in which the second surface is a surface on a side opposite to a surface facing the wavelength conversion layer in the reflection layer.

According to such a configuration, since the light incident via the wavelength conversion layer can be reflected toward the wavelength conversion layer, for example, it is possible to enhance the wavelength conversion efficiency of converting the light of the first wavelength into the light of the second wavelength compared to a wavelength conversion element in which a wavelength conversion portion does not have the reflection layer.

In the first aspect, it is preferable that the bonding material includes metal and is formed in a layered manner. As the metal, silver (Ag) can be exemplified. The term "layered manner" means that the bonding material bonds the substrate and the second surface not intermittently but uniformly like a metal bump when the bonding material bonds the substrate and the second surface of the wavelength conversion portion. In order to form the bonding material, metal paste may be sintered. The bonding material formed uniformly in a layered manner may contain fine bubbles inside thereof unless it is intermittent when visually observed with the naked eye like the metal bump. That is, the inside of the bonding material may be a porous metal layer.

According to such a configuration, since the bonding material positioned inside the second surface of the wavelength conversion portion includes metal and is formed in a layered manner, it is possible to configure the bonding material densely rather than intermittently like the metal bump. Therefore, it is possible to reliably transmit heat of the wavelength conversion portion to the substrate via the bonding material. Therefore, since the wavelength conversion portion can be cooled more efficiently, it is possible to further suppress the deterioration of the wavelength conversion efficiency of the wavelength conversion portion.

A light source device according to a second aspect of the invention includes the wavelength conversion element; and a light source that emits a light flux of the first wavelength toward the wavelength conversion element.

According to the second aspect, the same effect as that of the wavelength conversion element of the first aspect can be achieved. That is, in the light source device, it is possible to obtain the light source device in which the deterioration of the wavelength conversion efficiency of the wavelength conversion portion is suppressed by using the wavelength conversion element.

In the second aspect, it is preferable that when a base of a natural logarithm is e and a central intensity of the light flux of the first wavelength emitted from the light source is 1, an inside of the bonding region is irradiated with a partial light flux in the light flux of the first wavelength of which the light intensity is $1/e^2$ or more of the central intensity.

Moreover, when the base of the natural logarithm is e, the partial light flux of which the light intensity is $1/e^2$ or more of the central intensity corresponds to a light flux in light emitted from the light source which can be effectively utilized.

According to such a configuration, the same effect as that of the wavelength conversion element of the first aspect can be achieved. In addition, when the base of the natural logarithm is e and the central intensity of the light flux of the first wavelength emitted from the light source is 1, the partial light flux of which the light intensity is $1/e^2$ or more of the central intensity is emitted to the inside of the bonding region. Therefore, for example, even in a case where the outside of the bonding region is irradiated with the light flux of the first wavelength, since a region positioned outside the bonding region is irradiated with a light flux which cannot be effectively utilized, that is, a light flux of which the light intensity is relatively weak, it is possible to suppress an increase in the temperature of the wavelength conversion portion. Therefore, since the increase in the temperature of the wavelength conversion element can be suppressed, light including the light of the second wavelength can be stably emitted from the light source device.

In the second aspect, it is preferable that the light source device further includes a position changing portion that changes an irradiation position of the light flux in the irradiation region, the light flux of the first wavelength incident on the wavelength conversion element.

As the position changing portion, a pickup optical device for condensing the light flux of the first wavelength incident on the wavelength conversion element can be exemplified.

According to such a configuration, the irradiation position of the light flux of the first wavelength can be changed in the irradiation region by the position changing portion. Therefore, it is possible to suppress the increase in the temperature of the wavelength conversion element and to suppress deterioration of the wavelength conversion efficiency of the wavelength conversion element compared to a case where the light flux of the first wavelength is continuously incident on the irradiation region which is set in advance. In addition, the irradiation position of the light flux of the first wavelength can be changed in the irradiation region by the position changing portion; therefore, it is possible to suppress deterioration of the wavelength conversion element based on the incident light flux of the first wavelength compared to a case where the light flux of the first wavelength is continuously incident on the irradiation region that is set in advance. Therefore, light flux including the light of the second wavelength which is wavelength-converted by the wavelength conversion element can be further stably emitted. In addition, since deterioration of the wavelength conversion element can be suppressed, it is possible to extend the life of the wavelength conversion element and thus the light source device.

A projector according to a third aspect of the invention includes the light source device; alight modulation device that modulates light including the light flux of the first wavelength emitted from the light source device; and a projection optical device that projects light modulated by the light modulation device.

According to the third aspect, the same effect as that of the light source device of the second aspect can be achieved. In addition, since light flux including the light of the second wavelength can be stably emitted from the light source device, it is possible to stably project the projection image from the projection optical device and to enhance the reliability of the projector.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
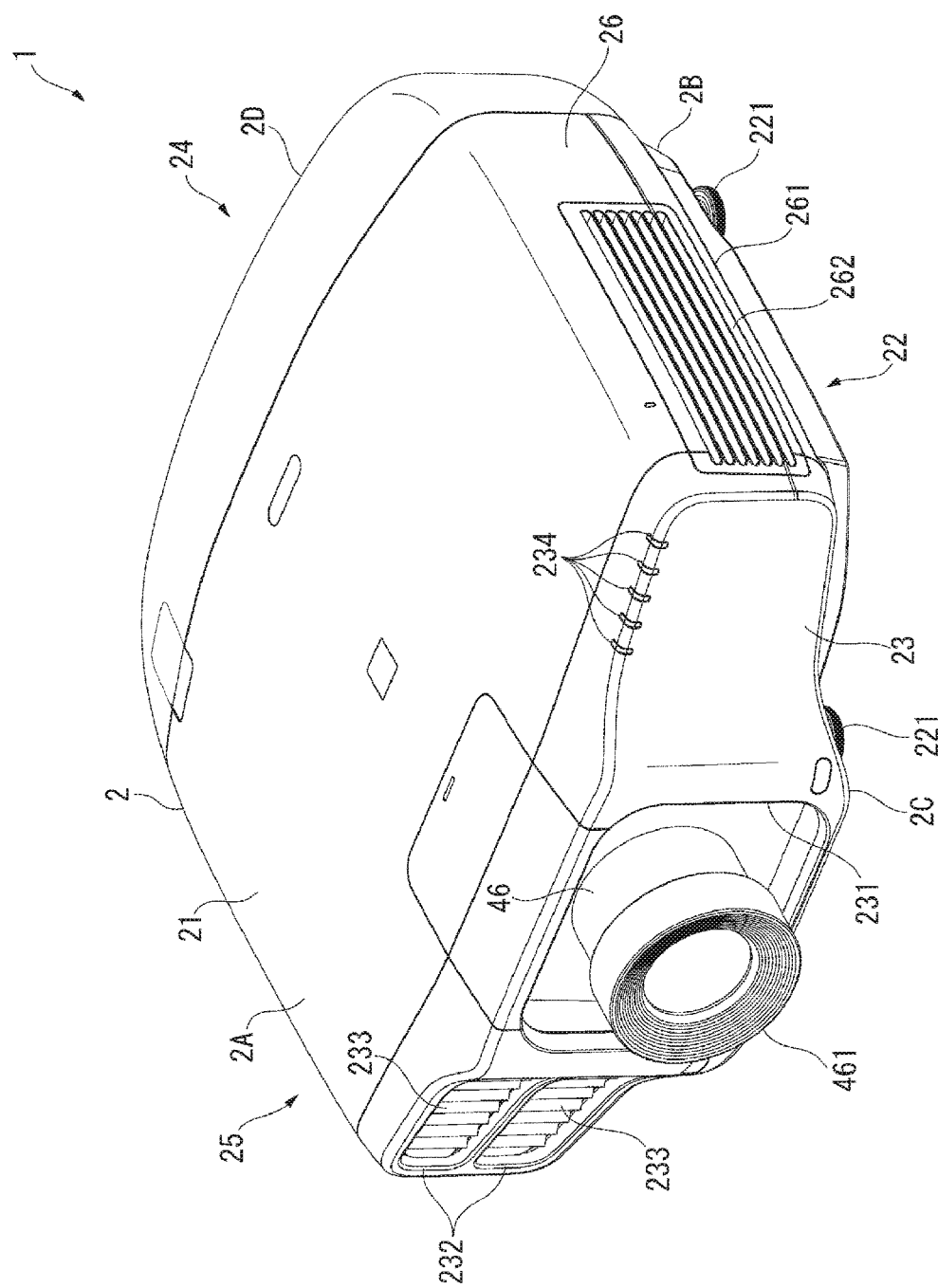
FIG. 1 is a perspective view illustrating an appearance of a projector according to an embodiment of the invention.

Hereinafter, an embodiment of the invention will be described with reference to the drawings.
Schematic Configuration of Projector FIG. 1 is a perspective view illustrating an appearance of a projector 1 according to the embodiment of the invention. The projector 1 according to the embodiment is a projection-type image display apparatus which forms an image according to image information by modulating light emitted from an illumination device 41 which is described below, and enlarges and projects the formed image on a projection surface PS such as a screen. As illustrated in FIG. 1, the projector 1 includes an exterior casing 2 constituting the appearance and an apparatus body 3 (see FIG. 2) that is housed and disposed within the exterior casing 2.

As will be described in detail later, such a projector 1 has one of features in which a bonding material 55 which bonds a substrate 51 and a wavelength conversion portion 52 is positioned inside a second surface (bonding surface 54B of a reflection layer 54) of the wavelength conversion portion 52, and excitation light emitted from a light source portion 411 is incident on an inside of a bonding region Ar1 where the bonding material 55 is positioned on a first surface (first surface 53A of a wavelength conversion layer 53) of the wavelength conversion portion 52 (see FIG. 3).

Hereinafter, a configuration of the projector 1 will be described.

Configuration of Exterior Casing

The exterior casing 2 is formed in a substantially rectangular parallelepiped shape by combining an upper case 2A, a lower case 2B, a front case 2C, and a rear case 2D which are respectively formed of synthetic resin. Such an exterior casing 2 has a top portion 21, a bottom portion 22, a front portion 23, a rear portion 24, a left portion 25, and a right portion 26.

In a case where the projector 1 is mounted on a mounting surface, leg portions 221 (only two leg portions 221 are illustrated in FIG. 1) being in contact with the mounting surface are placed at a plurality of places in the bottom portion 22.

At a center portion of the front portion 23, an end portion 461 of a projection optical device 46 which is described below is exposed and an opening 231 through which an image projected by the projection optical device 46 passes is formed.

In addition, at a position on a left portion 25 side in the front portion 23, an exhaust port 232 through which heat-bearing cooling gas within the exterior casing 2 is discharged is formed, and a plurality of louvers 233 are provided in the exhaust port 232.

On the other hand, a plurality of indicators 234 indicating an operation state of the projector 1 are provided at positions on a right portion 26 side in the front portion 23.

An inlet port 261 which introduces external air as cooling gas to the inside is formed in the right portion 26 side and a cover member 262 in which a filter (not illustrated) is provided is attached to the inlet port 261.

Configuration of Apparatus Body

Figure 2:
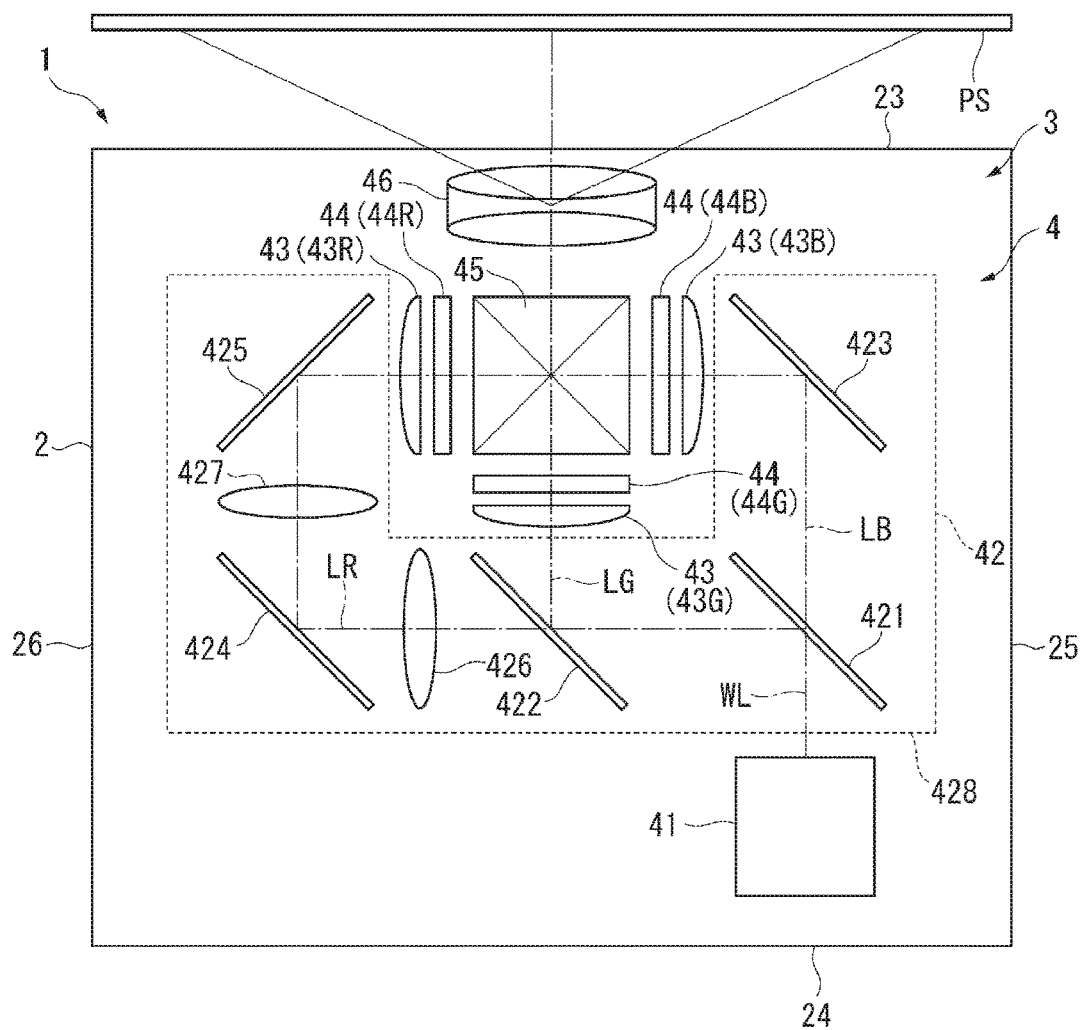
FIG. 2 is a schematic view illustrating a configuration of an apparatus body in the embodiment.

FIG. 2 is a schematic view illustrating a configuration of the apparatus body 3.

As illustrated in FIG. 2, the apparatus body 3 includes an image projection device 4. Although not illustrated, the apparatus body 3 includes a control device which controls an operation of the projector 1, a power supply device which supplies power to electronic components configuring the projector 1, and a cooling device which cools a cooling target.

Configuration of Image Projection Device

The image projection device 4 forms an image according to an image signal input from the control device and projects the image on the projection surface PS. The image projection device 4 includes the illumination device 41, a color separation device 42, collimating lenses 43, light modulation devices 44, a color synthesis device 45, and the projection optical device 46.

Among them, the illumination device 41 emits illumination light WL which uniformly illuminates the light modulation device 44. A configuration of the illumination device 41 will be described.

The color separation device 42 separates blue light LB, green light LG, and red light LR from the illumination light WL incident from the illumination device 41. The color separation device 42 includes dichroic mirrors 421 and 422, reflection mirrors 423, 424, and 425, relay lenses 426 and 427, and an optical component casing 428 for accommodating those members on an inside thereof.

The dichroic mirror 421 transmits the blue light LB included in the illumination light WL and reflects the green light LG and the red light LR. The blue light LB transmitted through the dichroic mirror 421 is reflected by the reflection mirror 423 and is guided to the collimating lens 43 (43B).

The dichroic mirror 422 reflects the green light LG, guides the green light LG to the collimating lens 43 (43G) among the green light LG and the red light LR reflected by the dichroic mirror 421, and transmits the red light LR. The red light LR is guided to the collimating lens 43 (43R) via the relay lens 426, the reflection mirror 424, the relay lens 427, and the reflection mirror 425.

The collimating lenses 43 (collimating lenses for each color of red, green, and blue are respectively referred to as 43R, 43G, and 43B) collimate the incident light.

The light modulation devices 44 (light modulation devices for each color of red, green, and blue are respectively referred to as 44R, 44G, and 44B) modulate the incident color lights LR, LG, and LB respectively, and form an image based on the color lights LR, LG, and LB according to an image signal input from a control device. Each of the light modulation devices 44 includes, for example, a liquid crystal panel that modulates the incident light, and polarizing plates that are respectively disposed on an incident side and an emitting side of the liquid crystal panel.

The color synthesis device 45 synthesizes images based on the color lights LR, LG, and LB incident from the light modulation devices 44R, 44G, and 44B respectively. In the embodiment, the color synthesis device 45 is constituted by a cross dichroic prism, but may be constituted by a plurality of dichroic mirrors.

The projection optical device 46 enlarges and projects the image synthesized by the color synthesis device 45 on the projection surface PS. As such a projection optical device 46, for example, it is possible to adopt a combination lens including a lens barrel and a plurality of lenses arranged in the lens barrel.

Configuration of Illumination Device

Figure 3:
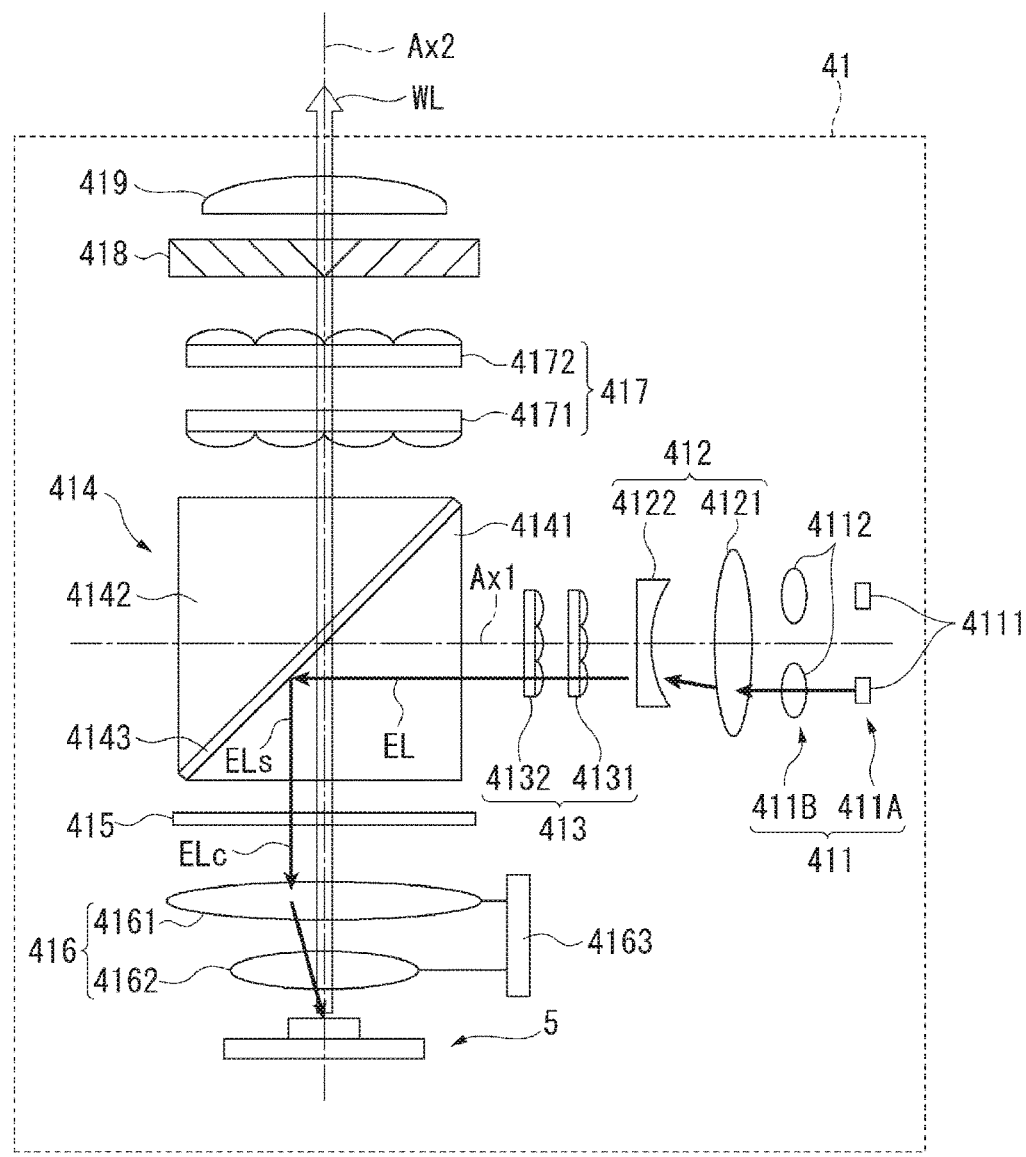
FIG. 3 is a schematic view illustrating a configuration of an illumination device in the embodiment.

FIG. 3 is a schematic view illustrating a configuration of the illumination device 41.

The illumination device 41 corresponds to the light source device according to the invention and emits the illumination light WL toward the color separation device 42. As illustrated in FIG. 3, the illumination device 41 includes the light source portion 411, an afocal optical device 412, a homogenizer optical device 413, a polarization separation device 414, a phase difference plate 415, a pickup optical device 416, a wavelength conversion element 5, an integrator optical device 417, a polarization conversion element 418, and a superimposing lens 419.

Among these members, the light source portion 411, the afocal optical device 412, and the homogenizer optical device 413 are disposed on a first illumination optical axis Ax1. On the other hand, the phase difference plate 415, the pickup optical device 416, the wavelength conversion element 5, the integrator optical device 417, the polarization conversion element 418, and the superimposing lens 419 are disposed on a second illumination optical axis Ax2 orthogonal to the first illumination optical axis Ax1. The polarization separation device 414 is disposed at an intersection portion of the first illumination optical axis Ax1 and the second illumination optical axis Ax2.

The light source portion 411 emits the excitation light EL that is the blue light toward the afocal optical device 412. The light source portion 411 includes an array light source 411A as a light source and a collimator optical device 411B on which the excitation light EL emitted from the array light source 411A is incident.

The array light source 411A has a configuration in which a plurality of semiconductor lasers 4111 are disposed in an array in an orthogonal plane to the first illumination optical axis Ax1. The semiconductor lasers 4111 are, for example, Laser Diodes (LDs) emitting the excitation light EL (blue light) having a peak wavelength in a wavelength range of 440 nm to 480 nm. In addition, the excitation light EL emitted from the semiconductor laser 4111 is coherently linearly polarized light and is emitted toward the polarization separation device 414 parallel to the first illumination optical axis Ax1. In the embodiment, a polarization direction of the excitation light EL emitted from each semiconductor laser 4111 coincides with a polarization direction of a polarization component reflected by a polarization separation layer 4143 of the polarization separation device 414, and the excitation light EL is s-polarized light.

The collimator optical device 411B converts the excitation light EL incident from the array light source 411A into parallel light. The collimator optical device 411B is configured to include, for example, a plurality of collimator lenses 4112 which are disposed in an array corresponding to the semiconductor lasers 4111. The excitation light EL that passes through such a collimator optical device 411B and is converted into the parallel light is incident on the afocal optical device 412.

The afocal optical device 412 adjusts a light flux diameter of the excitation light EL incident from the collimator optical device 411B. The afocal optical device 412 includes a condensing lens 4121 and a collimating lens 4122. The excitation light EL, which passes through such an afocal optical device 412 and of which the light flux diameter is adjusted, is incident on the homogenizer optical device 413.

The homogenizer optical device 413 cooperates with the pickup optical device 416 which is described later to equalize an illuminance distribution of the excitation light EL in the illumination region of the wavelength conversion element 5. The homogenizer optical device 413 includes multilens arrays 4131 and 4132 in which a plurality of small lenses are respectively arranged on a surface orthogonal to the first illumination optical axis Ax1 in a matrix. The excitation light EL emitted from such a homogenizer optical device 413 is incident on the polarization separation device 414.

The polarization separation device 414 allows one of the p-polarized light and the s-polarized light to pass therethrough and reflects the other polarized light. The polarization separation device 414 is configured as a so-called prism-type Polarizing Beam Splitter (PBS) including prisms 4141 and 4142 formed substantially in a shape of triangle pillar, and formed in a substantially overall rectangular parallelepiped shape. Interfaces of the prisms 4141 and 4142 are respectively inclined at an angle of 45° with respect to the first illumination optical axis Ax1 and the second illumination optical axis Ax2, and the polarization separation layer 4143 is disposed between the interfaces.

The polarization separation layer 4143 has a characteristic of separating the s-polarized light and the p-polarized light included in the excitation light EL and also has a characteristic of transmitting fluorescent light generated by the wavelength conversion element 5 which is described later regardless of a polarization state of the fluorescent light. That is, the polarization separation layer 4143 has a wavelength selective polarization separation characteristic which separates the s-polarized light and the p-polarized light with respect to light of a wavelength of a blue light region, but transmits the s-polarized light and the p-polarized light respectively with respect to light of a wavelength of a green light region and a red light region.

Such a polarization separation device 414 reflects the incident excitation light EL of the s-polarized light on the phase difference plate 415 side along the second illumination optical axis Ax2. As will be described in detail later, the polarization separation device 414 transmits the fluorescent light and the excitation light of the p-polarized light incident from the phase difference plate 415 side and combines the fluorescent light and the excitation light (blue light), and the combined light is incident on the integrator optical device 417.

Moreover, the polarization separation device 414 is not limited to the prism-type and may be a plate-type.

The phase difference plate 415 is a ¼ wavelength plate. The phase difference plate 415 converts s-polarized excitation light ELs incident from the polarization separation device 414 into circularly polarized excitation light Elc and the circularly polarized excitation light Elc is incident on the pickup optical device 416.

The pickup optical device 416 condenses the excitation light Elc incident from the phase difference plate 415 onto the wavelength conversion element 5. The pickup optical device 416 has two lenses 4161 and 4162, and a position changing portion 4163. Among them, the position changing portion 4163 is connected to two lenses 4161 and 4162 respectively, changes positions of the two lenses 4161 and 4162, and changes irradiation positions of the excitation light within an irradiation region Ar2 which is described later.

Moreover, in the embodiment, the pickup optical device 416 includes two lenses 4161 and 4162, but the number of lenses configuring the pickup optical device 416 is not limited to two and may be 1 or 3 or more. In addition, the position changing portion 4163 may be omitted.

The wavelength conversion element 5 is a reflection-type wavelength conversion element which diffuses and reflects a part of the excitation light ELc (light of the first wavelength) that is blue light incident from the pickup optical device 416, and converts the other part into the fluorescent light (light of the second wavelength) including green light and red light, and emits the fluorescent light. In the embodiment, the fluorescent light generated by the wavelength conversion element 5 is light having a peak wavelength in a wavelength region of 500 nm to 700 nm. Moreover, a configuration of the wavelength conversion element 5 will be described later.

The illumination light WL including the excitation light ELc and fluorescent light YL (see FIG. 4) emitted from such a wavelength conversion element 5 is incident on the phase difference plate 415 via the pickup optical device 416.

Among them, the excitation light ELc becomes circularly polarized light in a reverse direction to the circularly polarized light incident on the wavelength conversion element 5 when being reflected by the wavelength conversion element 5. In the course of passing through the phase difference plate 415 again, the excitation light ELc of the circularly polarized light of the reverse direction is converted into the excitation light of the p-polarized light of which the polarization direction is rotated by 90° with respect to the s-polarized light. The p-polarized excitation light passes through the polarization separation device 414 along the second illumination optical axis Ax2 and is incident on the integrator optical device 417 as blue light.

On the other hand, the fluorescent light YL emitted from the wavelength conversion element 5 is unpolarized light and the polarization separation layer 4143 has the wavelength selective polarization separation characteristic. Therefore, after passing through the pickup optical device 416 and the phase difference plate 415, the fluorescent light YL passes through the polarization separation device 414 along the second illumination optical axis Ax2 and is incident on the integrator optical device 417 as green light and red light.

Therefore, the white illumination light WL is incident on the integrator optical device 417 via the polarization separation device 414.

The integrator optical device 417 cooperates with the superimposing lens 419 to equalize the illuminance distribution of the illumination light WL in the light modulation device 44. Similar to the homogenizer optical device 413, the integrator optical device 417 includes lens arrays 4171 and 4172 in which a plurality of small lenses are respectively arranged on a surface orthogonal to the second illumination optical axis Ax2 in a matrix. The illumination light WL emitted from such an integrator optical device 417 is incident on the polarization conversion element 418.

The polarization conversion element 418 has a function of aligning the polarization direction of the incident illumination light WL. The illumination light WL emitted from the polarization conversion element 418 is incident on the superimposing lens 419.

Therefore, the illumination light WL via the superimposing lens 419 is incident on the dichroic mirror 421 of the color separation device 42.

Configuration of Wavelength Conversion Element

Figure 4:
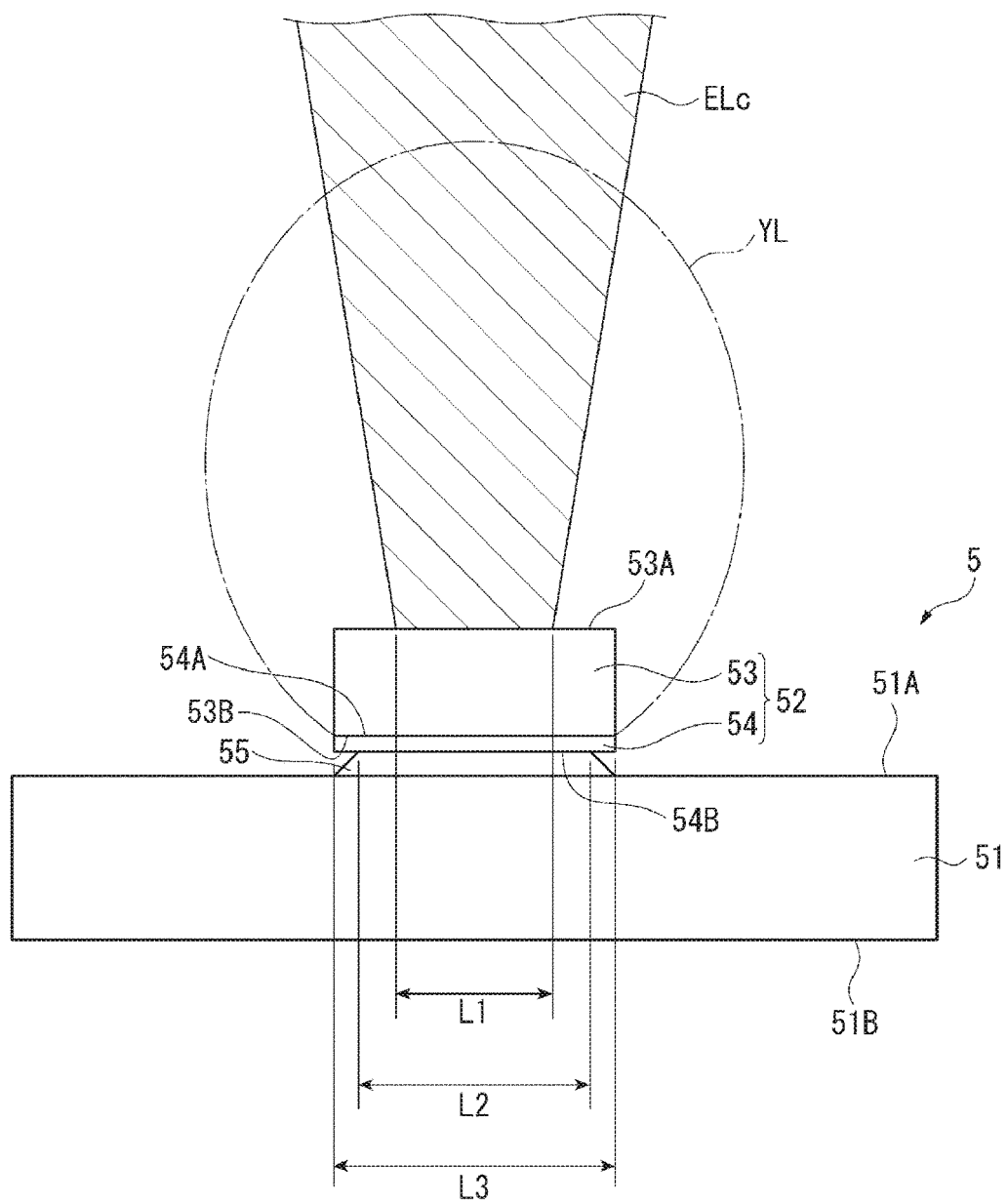
FIG. 4 is a side view illustrating a wavelength conversion element in the embodiment.
Figure 5:
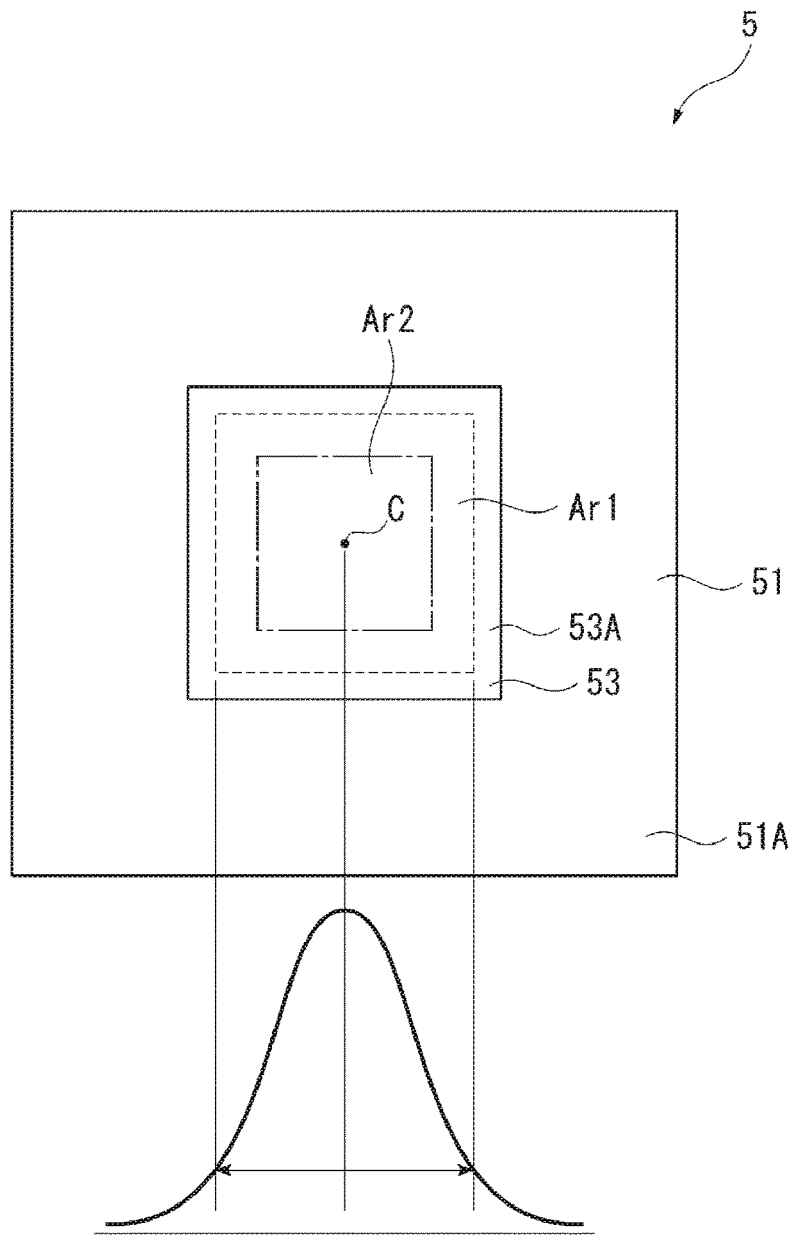
FIG. 5 is diagram illustrating a plane of the wavelength conversion element and a light intensity distribution of incident excitation light in the embodiment.

FIG. 4 is a side view illustrating the wavelength conversion element 5 and FIG. 5 is diagram illustrating a plane of the wavelength conversion element 5 and a light intensity distribution of the bonding region Ar1. Moreover, in FIG. 4, the excitation light ELc is indicated by oblique lines for easy understanding.

As described above, the wavelength conversion element 5 diffuses and reflects a part of the excitation light ELc incident from the pickup optical device 416, emits the fluorescent light YL generated by wavelength-converting the other part of the excitation light ELc to an incident side (that is, the pickup optical device 416 side) of the excitation light ELc. As illustrated in FIG. 4, the wavelength conversion element 5 has the substrate 51, the wavelength conversion portion 52, and the bonding material 55. In addition, among them, the wavelength conversion portion 52 has the wavelength conversion layer 53 and the reflection layer 54.

These are stacked on the substrate 51 in order of the wavelength conversion layer 53, the reflection layer 54, and the bonding material 55 from the incident side of the excitation light ELc from the pickup optical device 416.

Specifically, the bonding material 55 is positioned on one surface side (incident surface 51A side of the excitation light ELc) in the substrate 51 and bonds the substrate 51 and a bonding surface 54B of the reflection layer 54 corresponding to the second surface of the wavelength conversion portion 52. That is, the reflection layer 54 deposited (integrated) on the wavelength conversion layer 53 is bonded to the substrate 51 by the bonding material 55 so that the wavelength conversion layer 53 is fixed to the substrate 51.

Among them, the substrate 51 is a support substrate that supports the wavelength conversion portion 52 (wavelength conversion layer 53 and the reflection layer 54) via the bonding material 55 and is a radiation substrate that radiates heat conducted from the wavelength conversion portion 52. As illustrated in FIGS. 4 and 5, the substrate 51 is formed in a rectangular plate shape and is made of metal, ceramics, or the like.

Such a substrate 51 is fixed to a position where the excitation light ELc emitted from the pickup optical device 416 is incident on the wavelength conversion portion 52 (wavelength conversion layer 53).

As described above, the wavelength conversion portion 52 has the wavelength conversion layer 53 and the reflection layer 54. The wavelength conversion portion 52 has the first surface on which the excitation light ELc is incident and the second surface positioned on a side opposite to the first surface. That is, the first surface of the wavelength conversion portion 52 corresponds to the first surface 53A of the wavelength conversion layer 53 which is described below and the second surface of the wavelength conversion portion 52 corresponds to the bonding surface 54B of the reflection layer 54.

As described above, the wavelength conversion layer 53 is disposed on a side nearest to the pickup optical device 416 in the wavelength conversion element 5, that is, on the nearest to the incident side of the excitation light ELc incident from the pickup optical device 416 (wavelength conversion element 5).

The wavelength conversion layer 53 is excited by the incident excitation light ELc and emits the fluorescent light YL. That is, the wavelength conversion layer 53 wavelength-converts the excitation light ELc of the first wavelength (the wavelength region of the blue light) into the fluorescent light YL of the second wavelength (wavelength region of the green light and the red light). Such a wavelength conversion material of the wavelength conversion layer 53 includes a mixture of a yellow fluorescent substance, a green fluorescent substance, or a red fluorescent substance. A content ratio of the fluorescent substances is set based on the wavelength of the illumination light WL emitted from the illumination device 41. As the fluorescent substance, a ceramic fluorescent substance or a fluorescent substance obtained by mixing the fluorescent substance powder and a glass binder may be exemplified in consideration of bonding with the reflection layer 54. Moreover, in the embodiment, a thickness dimension of the wavelength conversion layer 53 is set to about 100 µm, but the thickness dimension may be smaller than 100 µm.

As illustrated in FIG. 5, such a wavelength conversion layer 53 is formed in a substantially rectangular shape and has the first surface 53A on which the excitation light ELc is incident and a second surface 53B which is positioned on a side (the reflection layer 54 side) in a direction opposite to the first surface 53A, and a reflection surface 54A of the reflection layer 54 is positioned on the second surface 53B.

The reflection layer 54 reflects light from the wavelength conversion layer 53 toward the wavelength conversion layer 53. As illustrated in FIG. 4, the fluorescent light YL emitted from the wavelength conversion layer 53 is diffused so as to spread outward from a substantially entire region of the wavelength conversion layer 53. Such a reflection layer 54 has the reflection surface 54A which is positioned on the wavelength conversion layer 53 side and reflects the light incident from the wavelength conversion layer 53, and the bonding surface 54B which is positioned on a side opposite to the reflection surface 54A. Among them, the bonding material 55 is positioned between the bonding surface 54B and the substrate 51.

Configuration of Bonding Material

The bonding material 55 bonds the reflection layer 54 of the wavelength conversion portion 52 and the substrate 51, and fixes the wavelength conversion layer 53 and the reflection layer 54 on the surface 51A of the substrate 51. As illustrated in FIG. 4, the bonding material 55 is formed in a substantially quadrangular pyramid shape enlarging toward an outer peripheral side as toward the substrate 51 side.

As illustrated in FIG. 4, the bonding material 55 is not intermittent like the metal bump but uniformly formed in a layered manner. In addition, the bonding material 55 is made of a metal paste containing metal. In the embodiment, the bonding material 55 is composed of a silver solder which is a metal paste containing silver (Ag) as the metal.

Such a bonding material 55 is coated on the surface 51A of the substrate 51 and is sintered to bond the substrate 51 and the reflection layer 54 (second surface of the wavelength conversion portion 52). The bonding material 55 is fixed to the bonding surface 54B of the reflection layer 54 and the surface 51A of the substrate 51, and the reflection layer 54 is fixed to the substrate 51.

Moreover, the bonding material 55 after sintering may be a porous silver plate containing minute air bubbles inside the bonding material unless it is intermittent when visually observed with the naked eye like a metal bump.

Position of Bonding Material on Substrate

As illustrated in FIGS. 4 and 5, such a bonding material 55 is positioned inside the bonding surface 54B that is the second surface of the wavelength conversion portion 52 when viewed along the advancing direction of the excitation light ELc incident on the wavelength conversion layer 53. Specifically, as illustrated in FIG. 5, the bonding region Ar1 to which the bonding surface 54B of the reflection layer 54 and the bonding material 55 are fixed is a substantially rectangular region positioned inside an outer peripheral end of the wavelength conversion layer 53. That is, a dimension L2 in a direction orthogonal to the incident direction of the excitation light ELc in the bonding region Ar1 is smaller than a dimension L3 of the wavelength conversion portion 52 in a direction orthogonal to the incident direction of the excitation light ELc. Therefore, the bonding material 55 is not positioned in the vicinity of the outer peripheral end of the wavelength conversion layer 53 and the reflection layer 54.

Here, in a case where the bonding material composed of the same metal paste as the bonding material 55 is positioned, for example, on an entire surface of the bonding surface 54B of the reflection layer 54 and aside surface of the wavelength conversion layer 53, the fluorescent light YL converted by the wavelength conversion layer 53 is shielded by the bonding material positioned in the vicinity of the outer peripheral end of the wavelength conversion layer 53 and the outer peripheral end of the reflection layer 54. Therefore, since the fluorescent light YL which should originally be emitted is not emitted from the vicinity of the outer peripheral end of the wavelength conversion layer 53 and the vicinity of the outer peripheral end of the reflection layer 54, the wavelength conversion efficiency of the wavelength conversion element 5 is deteriorated.

On the other hand, in the embodiment, the bonding material 55 is positioned inside the bonding surface 54B of the reflection layer 54 that is the second surface of the wavelength conversion portion 52. That is, since the bonding material 55 is not positioned in the wavelength conversion layer 53 and the outer peripheral end of the reflection layer 54, deterioration of emission efficiency, that is, the wavelength conversion efficiency of the fluorescent light YL emitted from the wavelength conversion element 5 can be suppressed by the bonding material 55.

Incident Position of Excitation Light on Wavelength Conversion Element

In addition, as illustrated in FIGS. 4 and 5, the inside of the bonding region Ar1 of the bonding surface 54B in which the bonding material 55 is positioned is irradiated with the excitation light ELc incident from the pickup optical device 416 on the wavelength conversion portion 52 (wavelength conversion layer 53) in the first surface (first surface 53A of the wavelength conversion layer 53) of the wavelength conversion portion 52. Specifically, the excitation light ELc incident from the pickup optical device 416 on the first surface (first surface 53A) of the wavelength conversion portion 52 is condensed toward a center C of the first surface 53A by the pickup optical device 416. Therefore, the irradiation region Ar2 of the excitation light ELc in the first surface 53A is positioned inside the bonding region Ar1. Therefore, a dimension L1 of the irradiation region Ar2 in the first surface 53A of the wavelength conversion layer 53 in the direction orthogonal to the incident direction of the excitation light ELc is smaller than the dimension L2 of the bonding region Ar1 in the first surface 53A. That is, when the wavelength conversion portion 52 is viewed from a direction along the incident direction of the excitation light ELc, a range in which the bonding material 55 is positioned in the wavelength conversion portion 52 is irradiated with the excitation light ELc.

Light Intensity Distribution of Bonding Region

The light intensity of the laser light which is emitted from the light source portion 411 and with which the irradiation region Ar2 is irradiated via the pickup optical device 416 is set to light having a light intensity capable of wavelength-converting by the wavelength conversion layer 53 of the wavelength conversion portion 52. Specifically, as illustrated in FIG. 5, the light intensity of the excitation light ELc with which the irradiation region Ar2 is irradiated is the highest at the center C of the irradiation region Ar2 and decreases as going to the outside. In any case, when the base of the natural logarithm is e and the central intensity (light intensity in the center C) of the light intensity of the excitation light ELc is 1, the partial light flux of which the light intensity is greater than $1/e^2$ is incident.

Here, in a case where the irradiation region Ar2 is irradiated with the excitation light ELc, a part of the excitation light ELc is incident on the outside of the irradiation region Ar2, or a part of the excitation light ELc is incident on the outside of the bonding region Ar1 on the first surface 53A.

On the other hand, in the embodiment, when the base of the natural logarithm is e and the central intensity of the light intensity of the excitation light ELc is 1, the partial light flux with $1/e^2$ or more, that is, the excitation light ELc of the light intensity capable of wavelength-converting by the wavelength conversion layer 53 of the wavelength conversion portion 52 is emitted on the inside (irradiation region Ar2) of the bonding region Ar1. Therefore, for example, even in a case where a part of the excitation light ELc is incident on the outside of the bonding region Ar1, the light flux of a range which is not effectively utilized, that is, a light flux of which the light intensity is relatively weak is incident on a region positioned outside the bonding region Ar1. Therefore, the temperature of the wavelength conversion portion 52 is unlikely to be increased. In other words, even in a case where an area of the irradiation region Ar2 is greater than an area of the bonding region Ar1, the light intensity of the excitation light ELc incident on the region positioned outside the bonding region Ar1 is configured such that when the base of the natural logarithm is e and the central intensity of the light intensity of the excitation light ELc is 1, light of less than $1/e^2$ is incident. Therefore, a heating value of the wavelength conversion portion 52 becomes small. Therefore, heat generated in the region outside the bonding region Ar1 is transmitted to the substrate 51 by the bonding material 55.

Effects of Embodiment

The projector 1 according to the embodiment described above has the following effects.

In the first surface 53A on which the excitation light ELc is incident in the wavelength conversion portion 52, the irradiation region Ar2 irradiated with the excitation light ELc is set inside the bonding region Ar1 of the bonding surface 54B in which the bonding material 55 is positioned. Therefore, it is possible to suppress that the excitation light ELc is incident on the region outside the bonding region Ar1. In addition, the bonding material 55 is reliably positioned at the position facing the irradiation region Ar2 in the second surface (bonding surface 54B) of the wavelength conversion portion 52. Therefore, in a case where the temperature of the irradiation region Ar2 is increased by the excitation light ELc with which the irradiation region Ar2 is irradiated, the heat of the irradiation region Ar2 (wavelength conversion portion 52) can be transmitted to the substrate 51 via the bonding material 55. Therefore, since the wavelength conversion portion 52 can be efficiently cooled, a decrease in the wavelength conversion efficiency of the wavelength conversion portion 52 can be suppressed.

Light incident by the reflection layer 54 via the wavelength conversion layer 53 can be reflected toward the wavelength conversion layer 53. Therefore, it is possible to enhance the wavelength conversion efficiency for converting the excitation light ELc into the fluorescent light YL, for example, compared to a wavelength conversion element in which the wavelength conversion portion 52 does not have the reflection layer 54.

The bonding material 55 which is positioned inside the bonding surface 54B that is the second surface of the wavelength conversion portion 52 is made of the metal paste containing silver (Ag). Therefore, the bonding material 55 can be formed not intermittently but uniformly in a layered manner like the metal bump. Thus, the heat of the wavelength conversion portion 52 can be reliably transmitted by the substrate 51 via the bonding material 55. Therefore, since the wavelength conversion portion 52 can be further reliably cooled, deterioration in the wavelength conversion efficiency of the wavelength conversion portion 52 can be further suppressed.

In the embodiment, when the base of the natural logarithm is e and the central intensity of the light intensity of the excitation light ELc is 1, the inside (irradiation region Ar2) of the bonding region Ar1 is irradiated with the partial light flux of the excitation light ELc of which the light intensity is $1/e^2$ or more of the central intensity. Therefore, for example, even in a case where a part of the excitation light ELc is incident on the outside of the bonding region Ar1, the light flux of the range which cannot be effectively utilized, that is, the light flux of which the light intensity is relatively weak is incident on the region positioned outside the bonding region Ar1. Therefore, it is possible to suppress the increase in the temperature of the wavelength conversion portion 52. Therefore, since the increase in the temperature of the wavelength conversion element 5 can be suppressed, the illumination light WL including the fluorescent light YL stably converted by the wavelength conversion element 5 from the illumination device 41 can be stably emitted.

The incident position of the excitation light ELc can be changed inside the irradiation region Ar2 by the position changing portion 4163 of the pickup optical device 416. Therefore, deterioration of the wavelength conversion element 5 can be suppressed based on the incident excitation light ELc compared to a case where the excitation light ELc is continuously incident on the irradiation region Ar2 that is set in advance. Therefore, the illumination light WL including the fluorescent light YL which is wavelength-converted by the wavelength conversion element 5 can be further stably emitted. In addition, since deterioration of the wavelength conversion element 5 can be suppressed, it is possible to extend the life of the wavelength conversion element 5 and thus the illumination device 41.

In addition, since the illumination light WL including the fluorescent light YL can be stably emitted from the illumination device 41, it is possible to stably project the projection image from the projection optical device 46 and to enhance the reliability of the projector 1.

Modification of Embodiment

The invention is not limited to the embodiment described above and includes variations, improvements, and the like within the scope of achieving the object of the invention.

In the embodiment described above, the wavelength conversion element 5 is configured as the reflection-type wavelength conversion element which emits the fluorescent light YL generated by the incidence of the excitation light ELc to the incident side of the excitation light ELc. However, the invention is not limited to the configuration and the wavelength conversion element 5 may be configured as a transmission-type wavelength conversion element which emits the fluorescent light YL from a surface on a side opposite to the surface 51A of the substrate 51. In this case, the substrate 51 is a translucent member, and in place of the reflection layer 54, a wavelength selective reflection layer which transmits the excitation light ELc and reflects the fluorescent light YL is disposed to the wavelength conversion layer 53 on a side opposite to the substrate 51, and thereby the transmission-type wavelength conversion element can be configured. That is, the wavelength conversion portion 52 of the wavelength conversion element 5 may not have the reflection layer 54.

In the embodiment described above, the bonding material 55 is made of the metal paste containing silver (Ag) as metal, but the invention is not limited to the configuration. For example, the bonding material 55 may be made of metal paste containing copper or tin as the metal.

In the embodiment described above, when the base of the natural logarithm is e and the central intensity of the light intensity of the excitation light ELc is 1, the inside of the bonding region Ar1 is irradiated with the partial light flux of the excitation light ELc of which the light intensity is $1/e^2$ or more of the central intensity. However, the invention is not limited to the configuration and the irradiation region Ar2 positioned inside the bonding region Ar1 may be irradiated with the partial light flux. In this case, even in a case where the outside of the irradiation region Ar2 is irradiated with the excitation light ELc, a light flux of a range which cannot be effectively utilized, that is, a light flux of which the light intensity is relatively weak is incident on the region positioned outside the irradiation region Ar2. Therefore, the increase in the temperature of the wavelength conversion portion 52 can be further suppressed.

In the embodiment described above, the pickup optical device 416 has the position changing portion 4163 which changes the incident position of the excitation light within the irradiation region Ar2. However, the invention is not limited to the configuration and the pickup optical device 416 may not have the position changing portion 4163. For example, in place of the position changing portion 4163, a movement mechanism which changes the position of the wavelength conversion element 5 with respect to the pickup optical device 416 may be provided. Therefore, it is possible to change the position of the irradiation region Ar2 of the excitation light ELc incident from the pickup optical device 416 on the first surface 53A of the wavelength conversion layer 53 by moving the wavelength conversion element 5.

In the embodiment described above, the wavelength conversion layer 53 is formed in a substantially rectangular shape (substantially square shape) when viewed along the incident direction of the excitation light ELc. However, the invention is not limited to the configuration and the wavelength conversion layer 53 may be, for example, formed in a substantially oblong shape or a substantially circular shape.

In addition, in the embodiment described above, the bonding region Ar1 and the irradiation region Ar2 are respectively formed in a substantially rectangular shape on the first surface 53A of the wavelength conversion layer 53 when viewed along the incident direction of the excitation light ELc, but the invention is not limited to the configuration and, for example, the bonding region Ar1 and the irradiation region Ar2 are respectively formed in a substantially oblong shape or a substantially circular shape according to the shape of the wavelength conversion layer 53. That is, the shape of the wavelength conversion portion 52 (the wavelength conversion layer 53) when viewed along the incident direction of the excitation light ELc can be appropriately changed.

In the embodiment described above, the image projection device 4 has the configuration illustrated in FIG. 2 and the illumination device 41 has the configuration and the disposition illustrated in FIG. 3. However, the invention is not limited to the configuration and the configuration and the disposition of the image projection device, the illumination device, and the light source device can be appropriately changed. For example, the light source portion 411 diffuses and reflects a part of the excitation light emitted from the semiconductor lasers 4111 using a diffusing device and the other part of the excitation light is incident on the wavelength conversion element 5 to generate the fluorescent light, and then the excitation light and the fluorescent light may be combined to be emitted. Specifically, the illumination device may have a configuration to include the wavelength conversion element 5 which emits light including blue light and the fluorescent light. In addition, the illumination device 41 may have a configuration to have a light source portion emitting blue light which is combined with the fluorescent light generated by the wavelength conversion element 5 separately from the semiconductor lasers 4111. Furthermore, the illumination light WL emitted by the illumination device 41 may not be white light.

In the embodiment described above, the projector 1 includes three light modulation devices 44 (44R, 44G, and 44B) including liquid crystal panels respectively. However, the invention is not limited to the configuration and a projector including two or less, or 4 or more light modulation devices may be applied to the invention.

In the embodiment described above, the projector includes the light modulation device 44 having the transmission-type liquid crystal panel having different light incident plane and light emitting plane. However, the invention is not limited to the configuration and the light modulation device having a reflection-type liquid crystal panel having the same light incident plane and light emitting plane may be applied. Furthermore, as long as it is a light modulation device capable of forming an image according to image information by modulating an incident light flux, a light modulation device using other than the liquid crystal such as a device using a micromirror and a device using a Digital Micromirror Device (DMD) may be applied.

In the embodiment described above, an example in which the wavelength conversion element 5 is applied to the illumination device 41 is given and an example in which the illumination device 41 including the wavelength conversion element 5 is applied to the projector is given. However, the invention is not limited to the configuration and the wavelength conversion element 5 may be applied to a device other than the illumination device 41, and the illumination device 41 may be applied to an electronic apparatus such as an illumination apparatus.

The entire disclosure of Japanese Patent Application No. 2016-189377, filed on Sep. 28, 2016 is expressly incorporated by reference herein.

What is claimed is:

1. A wavelength conversion element comprising:
   a substrate;
   a wavelength conversion portion that converts incident light of a first wavelength into light of a second wavelength different from the light of the first wavelength; and
   a bonding material that bonds the substrate and the wavelength conversion portion,
   wherein the wavelength conversion portion includes
   a first surface on which the light of the first wavelength is incident, and
   a second surface that is positioned on a side opposite to the first surface,
   wherein the bonding material bonds the substrate and the second surface of the wavelength conversion portion, and forms a bonding region inside the second surface when viewed along an advancing direction of the light incident on the wavelength conversion portion, and
   wherein the wavelength conversion portion is configured such that an irradiation region irradiated with the light of the first wavelength is set on the first surface inside the bonding region when viewed along the advancing direction of the light incident on the wavelength conversion portion.

2. The wavelength conversion element according to claim 1,
   wherein the wavelength conversion portion includes
   a wavelength conversion layer that converts the light of the first wavelength into the light of the second wavelength, and
   a reflection layer that reflects light incident via wavelength conversion layer, and
   wherein the second surface is a surface on a side opposite to a surface facing the wavelength conversion layer in the reflection layer.

3. The wavelength conversion element according to claim 1,
   wherein the bonding material includes metal and is formed in a layered manner.

4. The wavelength conversion element according to claim 2,
   wherein the bonding material includes metal and is formed in a layered manner.

5. A light source device comprising:
   the wavelength conversion element according to claim 1; and
   a light source that emits a light flux of the first wavelength toward the wavelength conversion element.

6. A light source device comprising:
   the wavelength conversion element according to claim 2; and
   a light source that emits a light flux of the first wavelength toward the wavelength conversion element.

7. A light source device comprising:
the wavelength conversion element according to claim 3; and
a light source that emits a light flux of the first wavelength toward the wavelength conversion element.

8. A light source device comprising:
the wavelength conversion element according to claim 4; and
a light source that emits a light flux of the first wavelength toward the wavelength conversion element.

9. The light source device according to claim 5,
wherein when a base of a natural logarithm is e and a central intensity of light intensity of the light flux of the first wavelength emitted from the light source is 1, an inside of the bonding region is irradiated with a partial light flux in the light flux of the first wavelength of which the light intensity is $1/e^2$ or more of the central intensity.

10. The light source device according to claim 5, further comprising:
a position changing portion that changes an irradiation position of the light flux in the irradiation region, the light flux of the first wavelength incident on the wavelength conversion element.

11. The light source device according to claim 9, further comprising:
a position changing portion that changes an irradiation position of the light flux in the irradiation region, the light flux of the first wavelength incident on the wavelength conversion element.

12. A projector comprising:
the light source device according to claim 5;
a light modulation device that modulates light including the light flux of the first wavelength emitted from the light source device; and
a projection optical device that projects light modulated by the light modulation device.

13. A projector comprising:
the light source device according to claim 9;
a light modulation device that modulates light including the light flux of the first wavelength emitted from the light source device; and
a projection optical device that projects light modulated by the light modulation device.

14. A projector comprising:
the light source device according to claim 10;
a light modulation device that modulates light including the light flux of the first wavelength emitted from the light source device; and
a projection optical device that projects light modulated by the light modulation device.

15. A projector comprising:
the light source device according to claim 11;
a light modulation device that modulates light including the light flux of the first wavelength emitted from the light source device; and
a projection optical device that projects light modulated by the light modulation device.

16. A projector comprising:
the light source device according to claim 6;
a light modulation device that modulates light including the light flux of the first wavelength emitted from the light source device; and
a projection optical device that projects light modulated by the light modulation device.

17. A projector comprising:
the light source device according to claim 7;
a light modulation device that modulates light including the light flux of the first wavelength emitted from the light source device; and
a projection optical device that projects light modulated by the light modulation device.

18. A projector comprising:
the light source device according to claim 8;
a light modulation device that modulates light including the light flux of the first wavelength emitted from the light source device; and
a projection optical device that projects light modulated by the light modulation device.

* * * * *